(12) United States Patent
Chung

(10) Patent No.: US 10,411,722 B2
(45) Date of Patent: Sep. 10, 2019

(54) HIGH-SPEED AND LOW-POWER PIPELINED ADC USING DYNAMIC REFERENCE VOLTAGE AND 2-STAGE SAMPLE-AND-HOLD

(71) Applicant: Korea University Research and Business Foundation, Sejong Campus, Sejong-si (KR)

(72) Inventor: Hayun Cecillia Chung, Sejong-si (KR)

(73) Assignee: KOREA UNIVERSITY RESEARCH AND BUSINESS FOUNDATION, SEJONG CAMPUS, Sejong-si (KR)

(*) Notice: Subject to any disclaimer, the term of this patent is extended or adjusted under 35 U.S.C. 154(b) by 0 days.

(21) Appl. No.: 16/168,336

(22) Filed: Oct. 23, 2018

(65) Prior Publication Data

US 2019/0131994 A1 May 2, 2019

(30) Foreign Application Priority Data

Oct. 26, 2017 (KR) .................. 10-2017-0139905
Jan. 31, 2018 (KR) .................. 10-2018-0011868

(51) Int. Cl.
*H03M 1/12* (2006.01)
*H03M 1/16* (2006.01)
*H03M 1/46* (2006.01)

(52) U.S. Cl.
CPC ......... *H03M 1/124* (2013.01); *H03M 1/1205* (2013.01); *H03M 1/1235* (2013.01); *H03M 1/164* (2013.01); *H03M 1/46* (2013.01)

(58) Field of Classification Search
CPC .... H03M 1/124; H03M 1/1235; H03M 1/164; H03M 1/1205; H03M 1/46
USPC .......................... 341/155, 161–162
See application file for complete search history.

(56) References Cited

U.S. PATENT DOCUMENTS 6,801,151 B1 * 10/2004 Opris .................... H03M 1/442
341/150
8,884,803 B2 * 11/2014 Chen ....................... H03M 1/12
341/155

* cited by examiner

*Primary Examiner* — Khai M Nguyen
(74) *Attorney, Agent, or Firm* — Saliwanchik, Lloyd & Eisenschenk

(57) ABSTRACT

Disclosed is a high-speed and low-power pipelined analog-digital converter (ADC) using a dynamic reference voltage and a 2-stage S/H. The pipelined ADC includes a 2-stage sample-and-hold (S/H) configured to secure a conversion time corresponding to a clock cycle per stage and to apply only a buffer to an input signal path, a reference voltage generator configured to receive the output of the D flip-flop of a previous stage as an input signal and to generate a required reference voltage during a half cycle of a sample frequency, and a comparator configured to include a linear transconductor (LT), a rail-to-rail latch (R2R) and a D flip-flop and to generate the output of the ADC and input to the reference voltage generator of a next stage for generating a reference voltage using the output of the D flip-flop.

11 Claims, 4 Drawing Sheets

HIGH-SPEED AND LOW-POWER PIPELINED ADC USING DYNAMIC REFERENCE VOLTAGE AND 2-STAGE SAMPLE-AND-HOLD

CROSS-REFERENCE TO RELATED APPLICATIONS

The present application claims the benefit of Korean Patent Application No. 10-2017-0139905, filed in the Korean Intellectual Property Office on Oct. 26, 2017, and Korean Patent Application No. 10-2018-0011868 filed in the Korean Intellectual Property Office on Jan. 31, 2018, the entire contents of which are incorporated herein by reference.

BACKGROUND OF THE INVENTION

1. Technical Field

Embodiment of the present inventions relate to an analog-to-digital converter (ADC) for converting an analog signal into digital code and, more particularly, to a high-speed and low-power pipelined ADC used at the front end of a high-speed backplane receiver configured to handle a high-speed signal of 10~20 Gbps.

2. Description of the Related Art

As the demand for fast communication speed continues to increases, a current backplane link system has become to support serial communication having a speed of 10~20 Gbps. Accordingly, a more powerful equalizer has been necessary to handle phenomena, such as a loss, bandwidth restriction and distortion through a link channel of a high-speed signal. However, a linear equalizer using a current summer of an analog method commonly used in the existing backplane receiver has problems in that it is difficult in a high-speed operation due to the limit of the conventional phenomena and it is sensitive to non-ideality in terms of the process.

In order to avoid such problems, there was proposed a method using a digital equalizer in which a front end ADC is positioned at the front end of the receiver and bits received from digital code converted by the ADC are restored. Such an ADC-based backplane receiver has many advantages in that it can easily apply a high-order equalizer algorithm and a digital circuit can be reconfigured and used even after chip fabrication and is insensitive to non-ideality in terms of the process.

In order to support a backplane receiver having a communication speed of several tens of Gbps, however, a converter having a sampling rate of several tens of GS/s is necessary. It is however very difficult to implement a converter that operates at a sampling rate of several tens of GS/s and has high resolution. A converter that belongs to converters having a sampling rate of 10~20 GS/s for backplane communication and that has resolution of 6 bits or more has not yet been made public. Most of converters consume excessively high power and have many difficulties in applying them to the backplane receiver. Accordingly, in order to realize an ADC-based backplane receiver, there is an urgent need for a high-speed and low-power ADC that operates at high speed and also has low power consumption.

SUMMARY OF THE INVENTION

An object of the present invention is to propose a method capable of implementing a low-power pipelined ADC capable of operating at a sampling rate of several tens of GS/s by moving a digital-analog converter (DAC) that limits a frequency band of a signal path requiring a high frequency band to a reference area including a DC voltage and doubling a conversion time assigned to each pipeline using a 2-stage sample-and-hole (S/H).

In an aspect, in a pipelined ADC including a plurality of stages proposed in an embodiment of the present invention, each stage includes a 2-stage sample-and-hold (S/H) configured to secure a conversion time corresponding to a clock cycle per stage and to apply only a buffer to an input signal path, a reference voltage generator configured to receive the output of the D flip-flop of a previous stage as an input signal and to generate a required reference voltage during a half cycle of a sample frequency, and a comparator configured to include a linear transconductor (LT), a rail-to-rail latch (R2R) and a D flip-flop and to generate the output of the ADC and input to the reference voltage generator of a next stage for generating a reference voltage using the output of the D flip-flop.

The 2-stage S/H doubles the conversion time of each stage.

The first stage of the 2-stage S/H samples and outputs the input signal, and the second stage of the 2-stage S/H samples the sampled DC signal of the first stage to remove unnecessary high-frequency transactions, thereby significantly reducing a required frequency bandwidth of a subsequent input signal path.

The reference voltage generator changes a level of the reference voltage using a digital-analog converter (DAC) in order to reduce parasitic capacitance of the input signal path requiring a high-speed operation and to increase a frequency bandwidth.

The reference voltage generator uses a resistive ladder and generates the reference voltage for the comparator of a current stage through multiplexing using output values up to a previous stage.

The reference voltage generator uses reference pre-distortion to offset the non-linearity of a voltage attributable to the buffer of the 2-stage S/H and to correct an offset of the comparator attributable to an on-die variation.

In another aspect, in an operating method of a pipelined analog-digital converter (ADC) including a plurality of stages, proposed in an embodiment of the present invention, each of the plurality of stages includes a 2-stage sample-and-hold (S/H), a comparator and a reference voltage generator. The operating method includes the steps of securing a conversion time corresponding to a clock cycle per stage through the 2-stage S/H applying only a buffer to an input signal path, receiving the output of a D flip-flop of a previous stage as an input signal and generating a required reference voltage during a half cycle of a sample frequency through the reference voltage generator, and generating the output of the ADC and input to the reference voltage generator of a next stage for generating a reference voltage using the output of the D flip-flop of the comparator including a linear transconductor (LT), a rail-to-rail latch (R2R) and the D flip-flop.

The step of securing a conversion time corresponding to a clock cycle per stage through the 2-stage S/H applying only a buffer to an input signal path includes sampling and outputting, by a first stage of the 2-stage S/H, the input signal and sampling, by a second stage of the 2-stage S/H, the sampled DC signal of the first stage to remove unnecessary high-frequency transactions, thereby significantly reducing a required frequency bandwidth of a subsequent input signal path.

The step of receiving the output of a D flip-flop of a previous stage as an input signal and generating a required reference voltage during a half cycle of a sample frequency through the reference voltage generator includes changing a level of the reference voltage using a digital-analog converter (DAC) in order to reduce parasitic capacitance of the input signal path requiring a high-speed operation and to increase a frequency bandwidth.

The step of receiving the output of a D flip-flop of a previous stage as an input signal and generating a required reference voltage during a half cycle of a sample frequency through the reference voltage generator includes using a resistive ladder and generating the reference voltage for the comparator of a current stage through multiplexing using output values up to a previous stage.

The step of generating the output of the ADC and input to the reference voltage generator of a next stage for generating a reference voltage includes using reference pre-distortion to offset the non-linearity of a voltage attributable to the buffer of the 2-stage S/H and to correct an offset of the comparator attributable to an on-die variation.

DETAILED DISCLOSURE

A high-speed backplane receiver must have low power consumption in order to optimize power consumption of the entire system while operating at high speed. Accordingly, an ADC used for the existing high-speed backplane receiver has been basically implemented in two types, that is, flash and successive approximation register (SAR).

A flash ADC is advantageous in high-speed sampling due to fast conversion speed, but has a disadvantage in that it has high power consumption because the number of comparators exponentially increases according to an increase in bit resolution.

An SAR ADC is advantageous in terms of power consumption because power consumption is very low, but has disadvantages in that total complexity increases because several SAR ADCs must be time-interleaved in order to realize a sampling rate of several tens of GS/s, that is, a target, due to slow conversion speed and performance deterioration may occur due to the mismatch of a delay time. A pipelined ADC is a compromise type of the two ADC types and has advantages in that the number of comparators increases in linear-proportion to bit resolution and throughput can be increased through pipelining. However, a pipelined ADC operating at a sampling rate of several tens of GS/s has not yet been implemented because it is very difficult to implement a pipeline stage operating at a sampling rate of several tens of GS/s. An embodiment of the present invention proposes a method capable of implementing a low-power pipelined ADC capable of operating at a sampling rate of several tens of GS/s by moving a digital-analog converter (DAC) that limits a frequency band of a signal path requiring a high frequency band to a reference area including a DC voltage and doubling a conversion time assigned to each pipeline using a 2-stage sample-and-hole (S/H). Hereinafter, embodiments of the present invention are described in detail with reference to the accompanying drawings.

Figure 1:
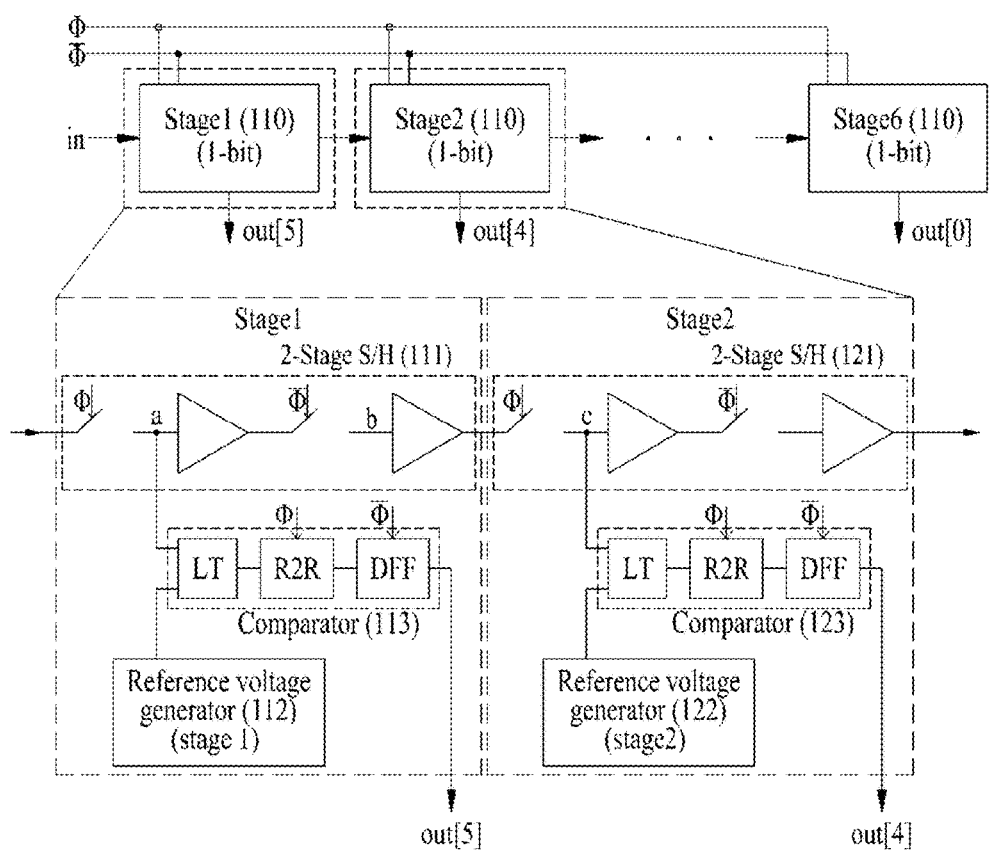
FIG. 1 is a diagram showing an overall configuration of a high-speed and low-power pipelined ADC using a dynamic reference voltage and the 2-stage S/H according to an embodiment of the present invention.

FIG. 1 is a diagram showing an overall configuration of a high-speed and low-power pipelined ADC using a dynamic reference voltage and the 2-stage S/H according to an embodiment of the present invention.

The proposed pipelined ADC includes a plurality of stages. The pipelined ADC according to an embodiment of the present invention includes six stages 110, 120, . . . , 160.

Each stage according to an embodiment of the present invention generates only the output of 1 bit in order to minimize a speed limit. Hereinafter, the structure of each stage is described with reference to the stage1 110.

The stage 110 includes a 2-stage S/H 111 configured to secure a conversion time corresponding to a clock cycle per stage and to apply only a buffer to an input signal path, a reference voltage generator 112 configured to receive the output of the D flip-flop of a previous stage as an input signal and to generate a reference voltage necessary during the half cycle of a sample frequency, and a comparator 113 configured to include a linear transconductor (LT), a rail-to-rail latch (R2R) and a D flip-flop (DFF) and to generate the output of the ADC and input to the reference voltage generator of a next stage for generating a reference voltage using the output of the D flip-flop.

Referring to FIG. 1, the pipelined ADC having a total of 6-bit resolution according to an embodiment of the present invention includes the six pipeline stages. The number of stages is only an embodiment, but is not limited to six.

The 2-stage S/H 111 according to an embodiment of the present invention can double the conversion time of each stage. The first stage of the 2-stage S/H 111 samples and outputs an input signal, and the second stage thereof samples the sampled DC signal of the first stage, thereby removing unnecessary high-frequency transactions. Accordingly, a frequency bandwidth necessary for an input signal path can be significantly reduced.

The reference voltage generator 112 according to an embodiment of the present invention changes a reference voltage level using a DAC in order to reduce parasitic capacitance of the input signal path that requires a high-speed operation and to increase a frequency bandwidth. The reference voltage generator 112 uses a resistive ladder, and generates a reference voltage necessary for the comparator of a current stage through multiplexing using output values up to a previous stage. Furthermore, the reference voltage generator 112 uses reference pre-distortion in order to offset the non-linearity of a voltage attributable to the buffer of the 2-stage S/H and to correct the offset of the comparator attributable to an on-die variation.

The LT, R2R and DFF have been used for the 1-bit comparator 113 according to an embodiment of the present invention. The output of the DFF is used as ADC output and also used as input to the reference voltage generator 122 of the stage2 120 for generating the reference voltage of the stage2 120, that is, a next stage.

Like the stage1 110, the stage2 120 includes a 2-stage S/H 121 configured to secure a conversion time corresponding to a clock cycle per stage and to apply only a buffer to an input signal path, a reference voltage generator 122 configured to receive the output of the D flip-flop of the previous stage as an input signal and to generate a reference voltage necessary during the half cycle of a sample frequency, and a comparator 123 configured to include a linear transconductor (LT), a rail-to-rail latch (R2R) and a D flip-flop (DFF) and to generate the output of the ADC and input to the reference voltage generator of a next stage for generating a reference voltage using the output of the D flip-flop. In this case, the reference voltage generator 122 is used as input to the reference voltage generator of a stage3 (not shown) for receiving the output of the DFF of the stage1 110 and generating the reference voltage of the stage3, that is, a next stage.

Figure 2:
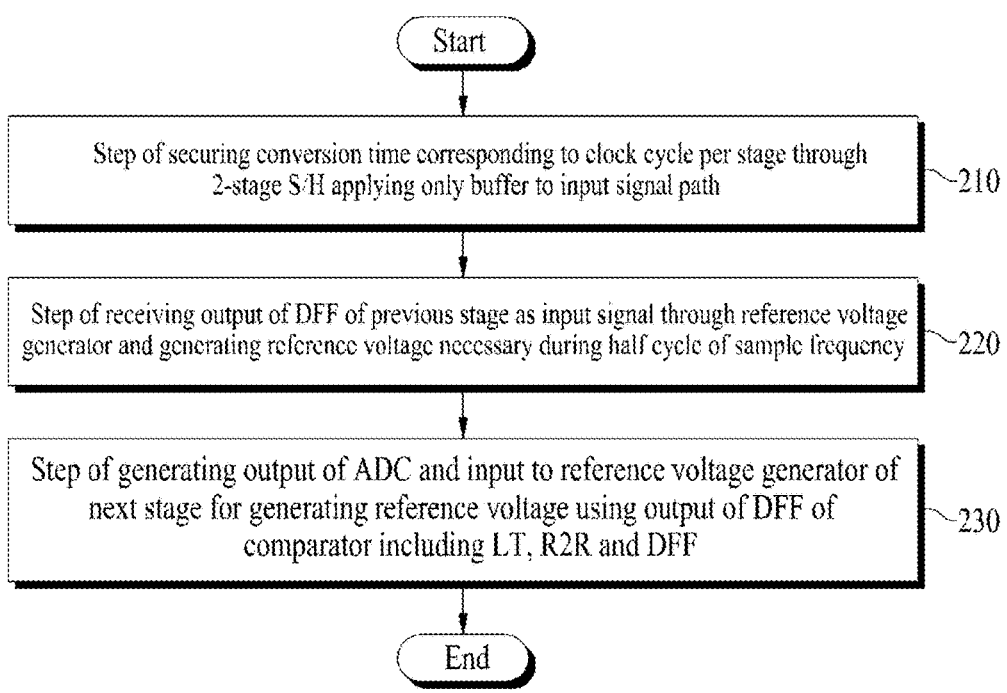
FIG. 2 is a flowchart for illustrating an operating method of the high-speed and low-power pipelined ADC using the dynamic reference voltage and the 2-stage S/H according to an embodiment of the present invention.

FIG. 2 is a flowchart for illustrating an operating method of the high-speed and low-power pipelined ADC using the dynamic reference voltage and the 2-stage S/H according to an embodiment of the present invention.

In the operating method of the pipelined ADC including a plurality of stages according to an embodiment of the present invention, each of the plurality of stages includes the 2-stage S/H, the comparator and the reference voltage generator. The proposed operating method of the pipelined ADC includes step 210 of securing a conversion time corresponding to a clock cycle per stage through the 2-stage S/H that applies only a buffer to an input signal path, step 220 of receiving the output of the DFF of a previous stage as an input signal through the reference voltage generator and generating a reference voltage necessary during the half cycle of a sample frequency, and step 230 of generating the output of the ADC and input to the reference voltage generator of a next stage for generating a reference voltage using the output of the DFF of the comparator including an LT, R2R and the DFF.

In step 210, the 2-stage S/H that applies only a buffer to the input signal path secures a conversion time corresponding to a clock cycle per stage. The 2-stage S/H according to an embodiment of the present invention can double the conversion time of each stage. The first stage of the 2-stage S/H samples and outputs the input signal, and the second stage thereof samples the sampled DC signal of the first stage, thereby removing unnecessary high-frequency transactions. Accordingly, a required frequency bandwidth of an input signal path can be significantly reduced.

In step 220, the reference voltage generator receives the output of the DFF of a previous stage as an input signal and generates a reference voltage necessary for during the half cycle of a sample frequency. In this case, a level of the reference voltage is changed using a DAC in order to reduce parasitic capacitance for an input signal path that requires a high-speed operation and to increase a frequency bandwidth. The reference voltage generator according to an embodiment of the present invention uses a resistive ladder and generates the reference voltage necessary for the comparator of a current stage through multiplexing using output values up to a previous stage. Furthermore, reference pre-distortion is used to offset the non-linearity of a voltage attributable to the buffer of the 2-stage S/H and to correct the offset of the comparator attributable to an on-die variation.

In step 230, the output of the ADC and input to the reference voltage generator of a next stage for generating a reference voltage are generated using the output of the DFF of the comparator including an LT, R2R and DFF.

The aforementioned method is the operation of one stage. Each stage of a pipelined ADC including a plurality of stages may perform a high-speed and low-power pipelined analog-digital conversion by performing steps 210~230.

In other words, a next stage also perform steps 210~230. The output of the DFF of the reference voltage generator of the next stage, generated in step 230, is transmitted as input to the reference voltage generator of a next stage and used as input to the reference voltage generator of the next stage.

Figure 3:
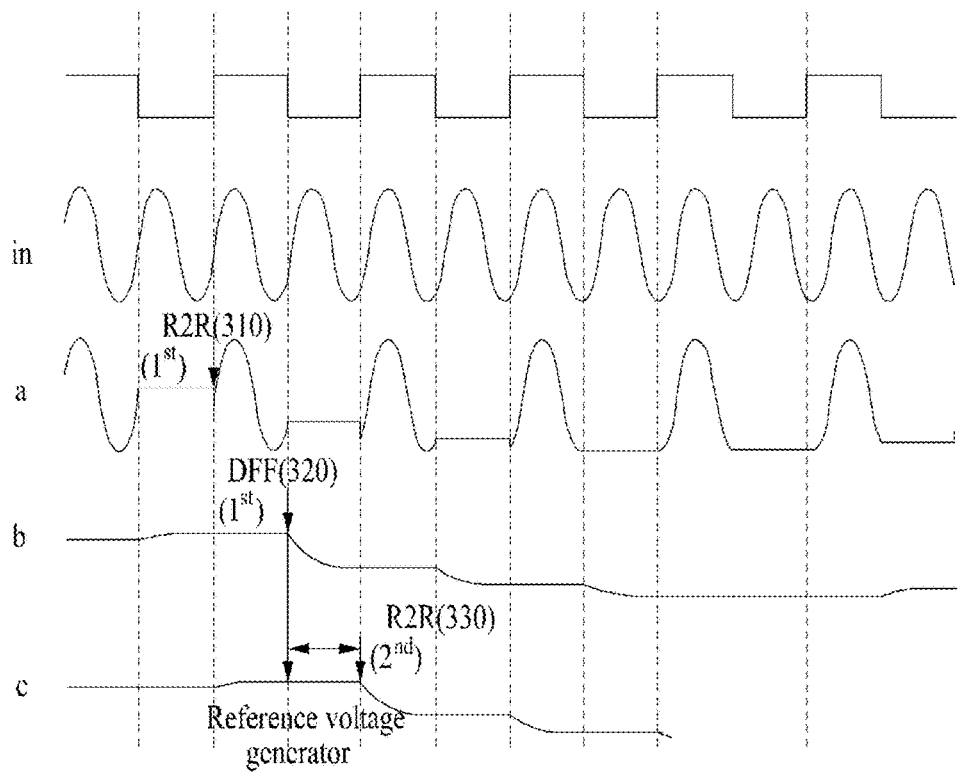
FIG. 3 is a timing diagram for illustrating a pipelined ADC operation according to an embodiment of the present invention.

FIG. 3 is a timing diagram for illustrating a pipelined ADC operation according to an embodiment of the present invention.

The output (node a) of the first stage of the 2-stage S/H of the stage1 samples a fast input signal (R2R(310)), and the output (node b) of the second stage thereof samples the sampled DC signal, thereby obviating unnecessary high-frequency transactions. Accordingly, they functions to significantly reduce a required frequency bandwidth of the path of a subsequent input signal (DFF(320)). Unlike in the case where a conventional pipelined ADC changes a value of an input signal path using a AC, in an embodiment of the present invention, only a buffer used for the S/H is applied to the input signal path, and a reference level of the comparator is changed using a DAC (R2R(330)). Such a method has advantages in that it can secure a high frequency band by excluding all of circuits that may limit a frequency band except a buffer essentially necessary for a pipeline operation in an input signal path that requires a high frequency band and can also reduce power consumption by minimizing the size of a required buffer. As shown in FIG. 3, the reference voltage generator has a reference voltage generation time corresponding to the half cycle (R2R(330)) of a sample frequency.

Figure 4:
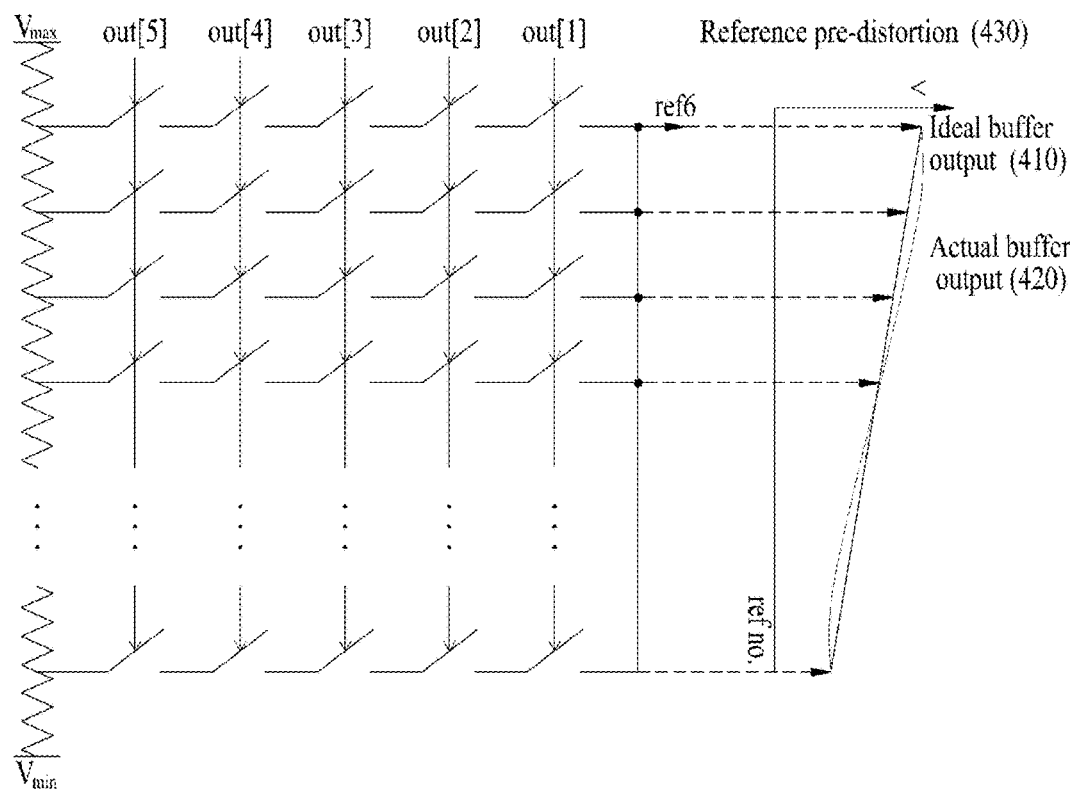
FIG. 4 is a diagram showing the structure of a reference voltage generator according to an embodiment of the present invention.

FIG. 4 is a diagram showing the structure of the reference voltage generator according to an embodiment of the present invention.

The reference voltage generator according to an embodiment of the present invention uses a resistive ladder, and generates a reference voltage for the comparator of a current stage through multiplexing using output values up to a previous stage. In this case, if a pass gate or a transmission gate is used as a switch, the generation of the reference voltage may be terminated within a half cycle because fast a multiplexing speed can be secured.

FIG. 4 shows the circuit of the reference voltage generator of a stage 6 having the greatest number of input values from a previous stage. The structure proposed in an embodiment of the present invention applies the 2-stage S/H in order to secure the conversion time of each pipeline stage. Accordingly, the number of buffers per stage is doubled. This may result in performance deterioration attributable to the non-linearity of a buffer. A graph on the right of FIG. 4 shows an ideal buffer output 410 of a signal passing through buffers and an actual buffer output 420 on which influences according to non-linearity has been accumulated. In order to offset the influence of the non-linearity, reference pre-distortion may be used. Reference pre-distortion is a method of offsetting a value corresponding to non-linearity using a voltage value according to the non-linearity as a reference voltage. In addition, if a circuit is configured so that a reference voltage can be selected within a specific reference calibration range, the offset of the comparator attributable to an on-die variation can also be offset. The calibration of the comparator through such reference pre-distortion can greatly improve effective resolution performance of an ADC.

In realizing an ADC-based backplane receiver having many advantages, such as compatibility with a high-order digital equalizer, insensitiveness to the non-ideality of a process and the easiness of a reconfiguration, the greatest restriction is limitations to high power consumption and speed of a front end ADC. It is expected that the dynamic-reference pipelined ADC proposed in an embodiment of the present invention can provide a base on which an ADC-based receiver can be used for future high-speed backplane communication more actively by greatly reducing power consumption while realizing a high operating speed.

The aforementioned apparatus may be implemented as a hardware component, a software component and/or a combination of them. For example, the apparatus and components described in the embodiments may be implemented using one or more general-purpose computers or special-purpose computers, for example, a processor, a controller, an arithmetic logic unit (ALU), a digital signal processor, a microcomputer, a field programmable array (FPA), a programmable logic unit (PLU), a microprocessor or any other device capable of executing or responding to an instruction. The processing apparatus may perform an operating system (OS) and one or more software applications executed on the OS. Furthermore, the processing apparatus may access, store, manipulate, process and generate data in response to the execution of software. For convenience of understanding, one processing apparatus has been illustrated as being used, but a person having ordinary skill in the art may understand that the processing apparatus may include a plurality of processing elements and/or a plurality of types of processing elements. For example, the processing apparatus may include a plurality of processors or a single processor and a single controller. Furthermore, other processing configurations, such as a parallel processor, are also possible.

Software may include a computer program, code, an instruction or a combination of one or more of them and may configure the processing apparatus to operate as desired or may instruct the processing apparatus independently or collectively. Software and/or data may be embodied in any type of a machine, component, physical device, virtual equipment, computer storage medium or device in order to be interpreted by the processing apparatus or to provide an instruction or data to the processing apparatus. Software may be distributed to computer systems connected over a network and may be stored or executed in a distributed manner. Software and data may be stored in one or more computer-readable recording media.

The method according to the embodiment may be implemented in the form of a program instruction executable by various computer means and stored in a computer-readable recording medium. The computer-readable recording medium may include a program instruction, a data file, and a data structure solely or in combination. The program instruction recorded on the recording medium may have been specially designed and configured for the embodiment or may have been known to those skilled in the computer software. The computer-readable recording medium includes a hardware device specially configured to store and execute the program instruction, for example, magnetic media such as a hard disk, a floppy disk and a magnetic tape, optical media such as CD-ROM and a DVD, magneto-optical media such as a floptical disk, ROM, RAM, and flash memory. Examples of the program instruction may include high-level language code executable by a computer using an interpreter in addition to machine-language code, such as code written by a compiler.

The dynamic-reference pipelined ADC according to the embodiments of the present invention can significantly reduce power consumption while realizing a high operation speed. Accordingly, an ADC-based receiver can be used for future high-speed backplane communication more actively.

As described above, although the embodiments have been described in connection with the limited embodiments and drawings, those skilled in the art may modify and change the embodiments in various ways from the description. For example, proper results may be achieved although the aforementioned descriptions are performed in order different from that of the described method and/or the aforementioned elements, such as the system, configuration, device, and circuit, are coupled or combined in a form different from that of the described method or replaced or substituted with other elements or equivalents.

Accordingly, other implementations, other embodiments, and equivalents of the claims belong to the scope of the claims.

What is claimed is:

1. A pipelined analog-digital converter (ADC) comprising a plurality of stages, wherein each stage comprises:
 a 2-stage sample-and-hold (S/H) configured to secure a conversion time corresponding to a clock cycle per stage and to apply only a buffer to an input signal path;
 a reference voltage generator configured to receive an output of a D flip-flop of a previous stage as an input signal and to generate a required reference voltage during a half cycle of a sample frequency; and
 a comparator configured to comprise a linear transconductor (LT), a rail-to-rail latch (R2R) and a D flip-flop and to generate an output of the ADC and input to a reference voltage generator of a next stage for generating a reference voltage using the output of the D flip-flop.

2. The pipelined ADC of claim 1, wherein the 2-stage S/H doubles the conversion time of each stage.

3. The pipelined ADC of claim 1, wherein:
 a first stage of the 2-stage S/H samples and outputs the input signal, and
 a second stage of the 2-stage S/H samples the sampled DC signal of the first stage to remove unnecessary high-frequency transactions, thereby significantly reducing a required frequency bandwidth of a subsequent input signal path.

4. The pipelined ADC of claim 1, wherein the reference voltage generator changes a level of the reference voltage using a digital-analog converter (DAC) in order to reduce parasitic capacitance of the input signal path requiring a high-speed operation and to increase a frequency bandwidth.

5. The pipelined ADC of claim 1, wherein the reference voltage generator uses a resistive ladder and generates the reference voltage for a comparator of a current stage through multiplexing using output values up to a previous stage.

6. The pipelined ADC of claim 1, wherein the reference voltage generator uses reference pre-distortion to offset non-linearity of a voltage attributable to the buffer of the 2-stage S/H and to correct an offset of the comparator attributable to an on-die variation.

7. An operating method of a pipelined analog-digital converter (ADC) comprising a plurality of stages, wherein each of the plurality of stages comprises a 2-stage sample-and-hold (S/H), a comparator and a reference voltage generator, and the operating method comprises steps of:
 securing a conversion time corresponding to a clock cycle per stage through the 2-stage S/H applying only a buffer to an input signal path;
 receiving an output of a D flip-flop of a previous stage as an input signal and generating a required reference voltage during a half cycle of a sample frequency through the reference voltage generator; and generating an output of the ADC and input to a reference voltage generator of a next stage for generating a reference voltage using the output of the D flip-flop of the comparator comprising a linear transconductor (LT), a rail-to-rail latch (R2R) and the D flip-flop.

8. The operating method of claim 7, wherein the step of securing a conversion time corresponding to a clock cycle per stage through the 2-stage S/H applying only a buffer to an input signal path comprises:
  sampling and outputting, by a first stage of the 2-stage S/H, the input signal, and
  sampling, by a second stage of the 2-stage S/H, the sampled DC signal of the first stage to remove unnecessary high-frequency transactions, thereby significantly reducing a required frequency bandwidth of a subsequent input signal path.

9. The operating method of claim 7, wherein the step of receiving an output of a D flip-flop of a previous stage as an input signal and generating a required reference voltage during a half cycle of a sample frequency through the reference voltage generator comprises changing a level of the reference voltage using a digital-analog converter (DAC) in order to reduce parasitic capacitance of the input signal path requiring a high-speed operation and to increase a frequency bandwidth.

10. The operating method of claim 7, wherein the step of receiving an output of a D flip-flop of a previous stage as an input signal and generating a required reference voltage during a half cycle of a sample frequency through the reference voltage generator comprises:
  using a resistive ladder, and
  generating the reference voltage for a comparator of a current stage through multiplexing using output values up to a previous stage.

11. The operating method of claim 7, wherein the step of generating an output of the ADC and input to a reference voltage generator of a next stage for generating a reference voltage comprises using reference pre-distortion to offset non-linearity of a voltage attributable to the buffer of the 2-stage S/H and to correct an offset of the comparator attributable to an on-die variation.

* * * * *